(12) United States Patent
Soer et al.

(10) Patent No.: US 8,836,917 B2
(45) Date of Patent: Sep. 16, 2014

(54) ZONE PLATE

(75) Inventors: Wouter Anthon Soer, Nijmegen (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 304 days.

(21) Appl. No.: 13/347,320

(22) Filed: Jan. 10, 2012

(65) Prior Publication Data

US 2012/0105961 A1  May 3, 2012

Related U.S. Application Data

(63) Continuation of application No. 12/466,185, filed on May 14, 2009, now Pat. No. 8,120,752.

(60) Provisional application No. 61/071,737, filed on May 15, 2008.

(51) Int. Cl.
| | | |
|---|---|---|
| G03B 27/72 | (2006.01) | |
| G02B 5/18 | (2006.01) | |
| G02B 27/44 | (2006.01) | |
| G02B 27/42 | (2006.01) | |
| G03F 7/20 | (2006.01) | |

(52) U.S. Cl.
CPC ............. G02B 27/44 (2013.01); G02B 5/1876 (2013.01); G21K 2201/067 (2013.01); G02B 27/4244 (2013.01); G02K 1/06 (2013.01); G03F 7/70191 (2013.01); G02B 5/1838 (2013.01)
USPC .............................. 355/71; 359/350; 359/565

(58) Field of Classification Search
USPC ................................ 355/67, 71; 359/350, 565
See application file for complete search history.

(56) References Cited

U.S. PATENT DOCUMENTS

| | | | |
|---|---|---|---|
| 5,442,480 | A | 8/1995 | Swanson et al. |
| 6,885,433 | B2 | 4/2005 | Shiraishi |
| 6,940,587 | B2 | 9/2005 | Van Der Laan et al. |
| 7,034,923 | B2 | 4/2006 | Bakker |
| 7,323,114 | B2 | 1/2008 | Chiu et al. |
| 7,639,418 | B2 | 12/2009 | Banine et al. |
| 2002/0094063 | A1 | 7/2002 | Nishimura et al. |
| 2003/0043475 | A1 | 3/2003 | Katsuma |
| 2006/0221440 | A1 | 10/2006 | Banine et al. |

FOREIGN PATENT DOCUMENTS

| | | | |
|---|---|---|---|
| JP | 06-275271 A | | 9/1994 |
| JP | 06275271 A | * | 9/1994 |
| JP | 07-191192 A | | 7/1995 |

(Continued)

OTHER PUBLICATIONS

Japanese Office Action for Japanese Patent Application No. 2009-114454, mailed on Sep. 6, 2011.

*Primary Examiner* — Glen Kao
(74) *Attorney, Agent, or Firm* — Pillsbury Winthrop Shaw Pittman LLP

(57) ABSTRACT

A zone plate includes a plurality of consecutively arranged, adjacent, and alternating first and second regions. The first regions are arranged to be substantially transparent to a first predetermined wavelength of radiation and a second predetermined wavelength of radiation that is different from the first predetermined wavelength of radiation. The second regions are arranged to be substantially opaque, diffractive, or reflective to the first predetermined wavelength of radiation and substantially transparent to the second predetermined wavelength of radiation.

10 Claims, 3 Drawing Sheets

(56) References Cited

FOREIGN PATENT DOCUMENTS

| JP | 2002-214400 A | 7/2002 |
| JP | 2004-289116 A | 10/2004 |
| JP | 2005-210127 A | 8/2005 |
| JP | 2006-191090 A | 7/2006 |
| JP | 2006-279036 A | 10/2006 |

* cited by examiner

ZONE PLATE

CROSS-REFERENCE TO RELATED APPLICATIONS

This application is a continuation application of U.S. application Ser. No. 12/466,185, filed May 14, 2009 and currently pending, which claims the benefit of priority from U.S. Provisional Patent Application No. 61/071,737, filed on May 15, 2008, the contents of both of which are incorporated herein by reference in their entireties.

FIELD

The present invention relates to a zone plate, and in particular, although not restricted to, a zone plate for use in lithography. For example, the zone plate may be used in a lithographic apparatus, or a radiation source for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation (EUV) having a wavelength within the range of 5-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV'.

Extreme ultraviolet radiation and beyond EUV radiation may be produced using a plasma. The plasma may be created for example by directing a laser at particles of a suitable material (e.g. tin), or by directing a laser at a stream of a suitable gas or vapor, such as Xe gas or Li vapor. The resulting plasma emits extreme ultraviolet radiation (or beyond EUV radiation), which is collected using a collector, which receives the extreme ultraviolet radiation and focuses the radiation into a beam.

EUV sources, such as those which generate EUV radiation using a plasma, not only emit desired 'in-band' EUV radiation, but may also emit undesirable 'out-of-band' radiation. This out-of-band radiation is most notably in the deep ultra violet (DUV) radiation range (100-400 nm). Moreover, in the case of some EUV sources, for example laser produced plasma EUV sources, the radiation from the laser, usually at 10.6 μm, presents a significant amount of out-of-band radiation.

In a lithographic apparatus, spectral purity is desired for several reasons. One reason is that resist is sensitive to out-of-band wavelengths of radiation, and thus the image quality of patterns applied to the resist may be deteriorated if the resist is exposed to such out-of-band radiation. Furthermore, out-of-band radiation infrared radiation, for example the 10.6 μm radiation in some laser produced plasma sources, may lead to unwanted and unnecessary heating of the patterning device, substrate and optics within the lithographic apparatus. Such heating may lead to damage of these elements, a degradation in their lifetime, and/or defects or distortions in patterns projected onto and applied to a resist-coated substrate.

In order to overcome these potential problems, several transmissive spectral purity filters have been proposed which substantially prevent the transmission of infrared radiation, for example, radiation having a wavelength of 10.6 μm, while simultaneously allowing the transmission of EUV radiation. Proposed spectral purity filters may comprise a thin metal layer, and/or an array of apertures. These spectral purity filters have an EUV transmittance of typically 50-80%, with, for example, maximum values of around 78% for a Zr/Si multi-layer foil.

In any lithographic apparatus, it will be appreciated that it is desirable to minimize the losses in intensity of radiation which is being used to apply a pattern to a resist coated substrate. One reason for this is that, ideally, as much radiation as possible should be available for applying a pattern to a substrate, for instance to reduce the exposure time and increase throughput.

SUMMARY

It is therefore an aspect of the present invention to provide an apparatus which serves as an improved spectral impurity filter, and, for example, a spectral purity filter which increases the EUV transmittance in comparison with the spectral purity filters mentioned above.

According to an aspect of the present invention there is provided a zone plate that includes a plurality of consecutively arranged, adjacent, and alternating first and second regions. The first regions are arranged to be substantially transparent to a first predetermined wavelength of radiation and a second predetermined wavelength of radiation that is different from the first predetermined wavelength of radiation. The second regions are arranged to be substantially opaque, diffractive, or reflective to the first predetermined wavelength of radiation and substantially transparent to the second predetermined wavelength of radiation.

The first and second wavelengths are 'predetermined' in that the respective regions of the zone plate are specifically designed to be substantially transparent or opaque to one or more chosen wavelengths of radiation. In other words, the first and second regions are not coincidentally transparent and/or opaque to one or more chosen wavelengths of radiation.

The first wavelength may be a wavelength in the infrared part of the electromagnetic spectrum. The first wavelength may be 10.6 μm. The first wavelength may be a wavelength in the deep ultraviolet part of the electromagnetic spectrum. The first wavelength may be in the range of 100 nm to 400 nm.

The second wavelength may be a wavelength in the extreme ultraviolet part of the electromagnetic spectrum. The second wavelength may be in the range of 5 nm to 20 nm. The second wavelength may be in the range of 13 nm to 14 nm, or 6.7 nm to 6.8 nm.

The first regions may be more transparent or less transparent to the first wavelength of radiation than the second regions are to the first wavelength of radiation.

The first regions may be formed by gaps or spaces in the zone plate. The first regions may comprise Si or $Si_3N_4$. The second regions may comprise a metal layer, a metal multilayer structure, a foil, or a multilayer foil. The second regions may comprise a Zr/Si multilayer foil. The second regions may comprise a structure or material that acts as a transmissive spectral purity filter, and which transmits more radiation having the second wavelength of radiation than it does radiation having the first wavelength of radiation The first and second regions may be concentric rings. The first and second regions may be parallel lines.

The first regions may be provided with a plurality of apertures. The apertures of the first regions may be of a dimension which does not result in substantial diffraction of the first wavelength of radiation. The second regions may be provided with a plurality of apertures. The apertures of the second regions may be of a dimension which results in diffraction or reflection of the first wavelength of radiation. The apertures may be holes or slits.

According to an aspect of the present invention there is provided an arrangement comprising: a zone plate; and a structure provided with an aperture.

The zone plate and aperture may be located relative to one another such that a focal point of the zone plate for the first wavelength of radiation is located away from the aperture.

The zone plate maybe located downstream of a focus point of a radiation beam comprising the first wavelength of radiation and the second wavelength of radiation, the zone plate being located downstream of the focus point by a distance equal to the focal length of the zone plate for the first wavelength of radiation, such that a parallel beam of radiation comprising the first wavelength of radiation emerges from the zone plate and is arranged to pass through the aperture.

According to an aspect of the present invention there is provided a radiation source comprising a zone plate or arrangement.

According to an aspect of the present invention there is provided a lithographic apparatus comprising a zone plate or an arrangement.

The lithographic apparatus may further comprise: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

The lithographic apparatus may further comprise a radiation source, and the zone plate or arrangement may be located in, or form a part of, the radiation source.

Regions that are described as being substantially transparent to a wavelength of radiation may have a transmittance for that wavelength of greater than 70%, more preferable greater than 80% and more preferably still greater than 90%. Regions that are described as being substantially opaque to a wavelength of radiation may have a transmittance for that wavelength of less than 30%, more preferable less than 20% and more preferably still less than 10%. Regions that are opaque may also be reflective.

According to an aspect of the present invention, there is provided a filter arrangement that is constructed and arranged to filter a first predetermined wavelength of radiation from a second predetermined wavelength of radiation that is different from the first predetermined wavelength of radiation. The filter arrangement includes a zone plate comprising a plurality of consecutively arranged, adjacent, and alternating first and second regions. The first regions are arranged to be substantially transparent to the first predetermined wavelength of radiation and the second predetermined wavelength of radiation. The second regions are arranged to be substantially opaque, diffractive, or reflective to the first predetermined wavelength of radiation and substantially transparent to the second predetermined wavelength of radiation. The filter arrangement also includes a structure that includes an aperture. The structure is positioned relative to the zone plate so that the first predetermined wavelength of radiation or the second predetermined wavelength of radiation passes through the aperture and the other of the first predetermined wavelength of radiation and the second predetermined wavelength of radiation does not pass through the aperture.

According to an aspect of the present invention, there is provided a radiation source configured to generate radiation. The radiation source includes a zone plate that includes a plurality of consecutively arranged, adjacent, and alternating first and second regions. The first regions are arranged to be substantially transparent to a first predetermined wavelength of radiation and a second predetermined wavelength of radiation that is different from the first predetermined wavelength of radiation. The second regions are arranged to be substantially opaque, diffractive, or reflective to the first predetermined wavelength of radiation and substantially transparent to the second predetermined wavelength of radiation.

According to an aspect of the present invention, there is provided a radiation source configured to generate radiation. The radiation source includes a filter arrangement constructed and arranged to filter a first predetermined wavelength of radiation from a second predetermined wavelength of radiation that is different from the first predetermined wavelength of radiation. The filter arrangement includes a zone plate comprising a plurality of consecutively arranged, adjacent, and alternating first and second regions. The first regions are arranged to be substantially transparent to the first predetermined wavelength of radiation and the second predetermined wavelength of radiation. The second regions are arranged to be substantially opaque, diffractive, or reflective to the first predetermined wavelength of radiation and substantially transparent to the second predetermined wavelength of radiation. The filter arrangement also includes a structure that includes an aperture. The structure is positioned relative to the zone plate so that the first predetermined wavelength of radiation or the second predetermined wavelength of radiation passes through the aperture and the other of the first predetermined wavelength of radiation and the second predetermined wavelength of radiation does not pass through the aperture.

According to an aspect of the present invention, there is provided a lithographic apparatus that includes a radiation source configured to generate a radiation beam, and a zone plate that includes a plurality of consecutively arranged, adjacent, and alternating first and second regions. The first regions are arranged to be substantially transparent to the first predetermined wavelength of radiation and the second predetermined wavelength of radiation, and the second regions are arranged to be substantially opaque, diffractive, or reflective to the first predetermined wavelength of radiation and substantially transparent to the second predetermined wavelength of radiation. The apparatus includes an illumination system configured to condition the radiation beam, and a support constructed to support a patterning device. The patterning device is capable of imparting the radiation beam with a pattern in its cross-section to form a patterned radiation beam. The apparatus includes a substrate table constructed to hold a substrate, and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
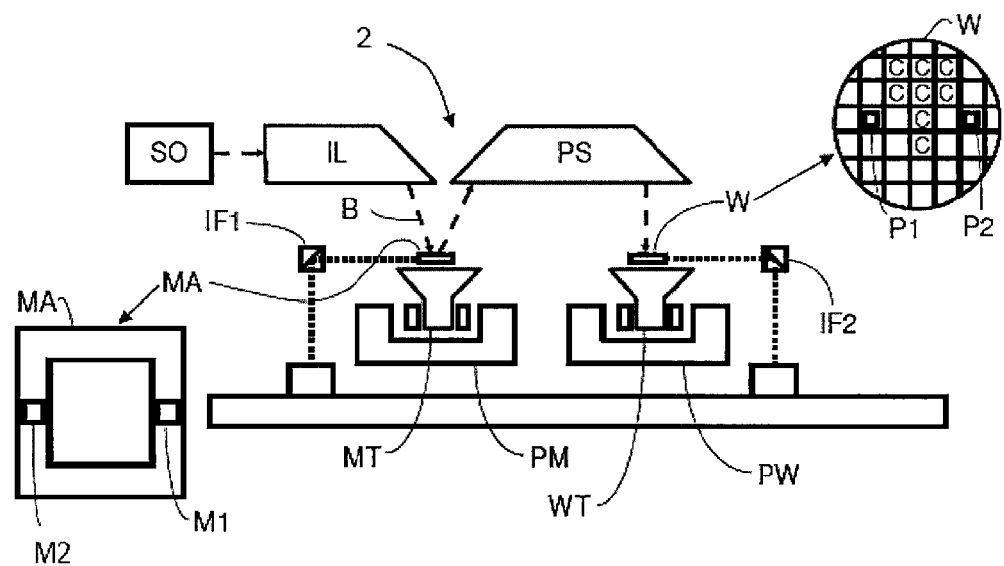
FIG. 1 schematically depicts a lithographic apparatus according to an embodiment of the invention.

FIG. 1 schematically depicts a lithographic apparatus 2 according to an embodiment of the invention. The apparatus 2 comprises: an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus 2, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in a EUV (or beyond EUV) radiation lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 2 is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 2 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
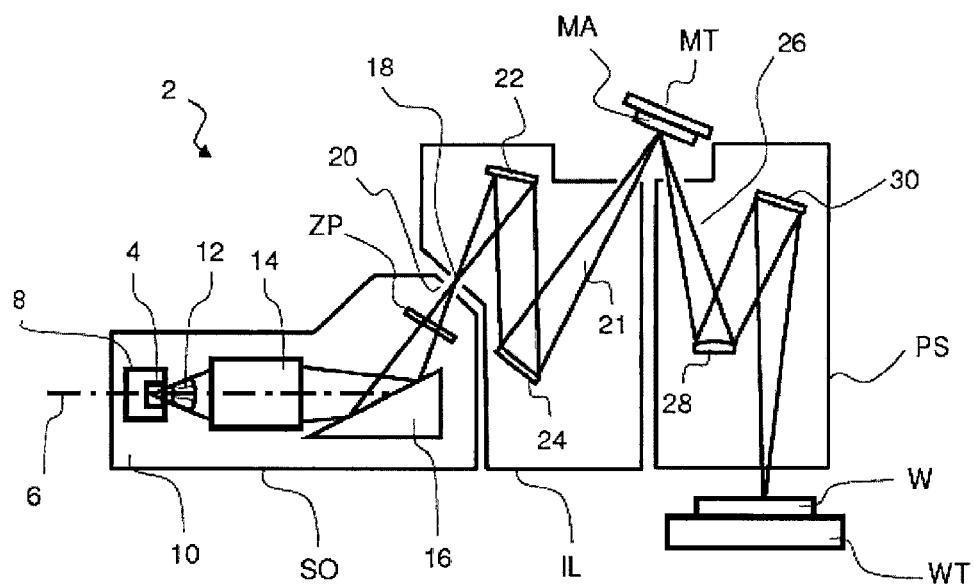
FIG. 2 is a more detailed schematic illustration of the lithographic apparatus shown in FIG. 1.

FIG. 2 shows the apparatus 2 in more detail, including a radiation source SO, an illuminator IL (sometimes referred to as an illumination system), and the projection system PS. The radiation source SO includes a radiation emitter 4 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis 6. Partial pressures of for example 10 Pa of Xe or Li vapor or any other suitable gas or vapor may be desired for efficient generation of the radiation. In some embodiments, tin may be used. FIG. 2 illustrates a discharge produced plasma (DPP) radiation source SO. It will be appreciated that other sources may be used, such as for example a laser produced plasma (LPP) radiation source.

The radiation emitted by radiation emitter 4 is passed from a source chamber 8 into a collector chamber 10. The collector chamber 10 includes a contamination trap 12 and grazing incidence collector 14 (shown schematically as a rectangle). Radiation allowed to pass through the collector 14 is reflected off a grating spectral filter 16 to be focused in a virtual source point 18 at an aperture 20 in the collector chamber 10. Before passing through the aperture 20, the radiation passes through a zone plate ZP. The zone plate ZP and its significance to the present invention is described in more detail below. From collector chamber 10, a beam of radiation 21 is reflected in the illuminator IL via first and second reflectors 22, 24 onto a reticle or mask MA positioned on reticle or mask table MT. A patterned beam of radiation 26 is formed which is imaged in projection system PS via first and second reflective elements 28, 30 onto a substrate W held on a substrate table WT.

It will be appreciated that more or fewer elements than shown in FIG. 2 may generally be present in the source SO, illumination system IL, and projection system PS. For instance, in some embodiments the lithographic apparatus 2 may not comprise a grating spectral filter 16, and the zone plate ZP may serve as the spectral filter.

As discussed above, it is known to use a spectral purity filter in a lithographic apparatus to filter out undesirable wavelength components of a radiation beam. For instance, it is known to provide a spectral purity filter comprising one or more metallic layers or foils which are substantially transparent to EUV radiation, but are substantially opaque to, for example, infrared radiation (for example, radiation having a wavelength of 10.6 µm). One of the drawbacks associated with such spectral purity filters is that their EUV transmittance is typically 50-80%, with maximum values of around 78% for a Zr/Si multilayer foil. It is desirable to increase the transmittance of a spectral purity filter while still minimizing or eliminating the amount of, for example, infrared radiation passing through the filter. According to an embodiment of the present invention, it has been realized that a specially designed zone plate can address problems or disadvantages inherent in known spectral purity filters.

A zone plate is a device typically used to focus radiation. Unlike lenses however, zone plates use diffraction to focus the radiation, instead of refraction. Zone plates are sometimes referred to as Fresnel zone plates. A typical zone plate consists of a set of radially symmetric rings, known as Fresnel zones, which alternate between being opaque and transparent to the radiation which the zone plate is designed to focus. Radiation incident on the zone plates will diffract around the opaque zones via the transparent zones. The zones can be spaced so that the diffracted radiation constructively interferes at a desired focal point.

The mathematics describing the function and design of a zone plate are known in the art and so will not be described in detail here. It is sufficient to say that, in order to achieve constructive interference at the focus, the zones of the zone plate should switch from opaque to transparent at radii where:

$$r_n = \sqrt{n\lambda f + \frac{n^2\lambda^2}{4}} \qquad (1)$$

Where $r_n$ is the radius of zone n, n is an integer representing the zone number, $\lambda$ is the wavelength of the radiation that the zone plate is to be designed to focus, and f is the distance from the center of the zone plate to the focus. When the zone plate is small compared to the focal length, the above equation can be approximated as:

$$r_n \approx \sqrt{n\lambda f} \qquad (2)$$

The width of the outermost ring (or zone) is given by:

$$\frac{dr_n}{dn} = \sqrt{f\lambda}\frac{1}{2\sqrt{n}} = \frac{f\lambda}{2r_n} \qquad (3)$$

It will be appreciated from the above description, and from known zone plates in general, that zone plates are formed from a plurality of consecutively arranged, adjacent and alternating first and second regions, the first and second regions being respectively opaque and transparent to the radiation which the zone plate is designed to focus. Embodiments of the present invention combine the properties of a zone plate and those of a continuous (e.g. foil sheet) spectral purity filter to create a structure which serves as an improved spectral purity filter.

Figure 3:
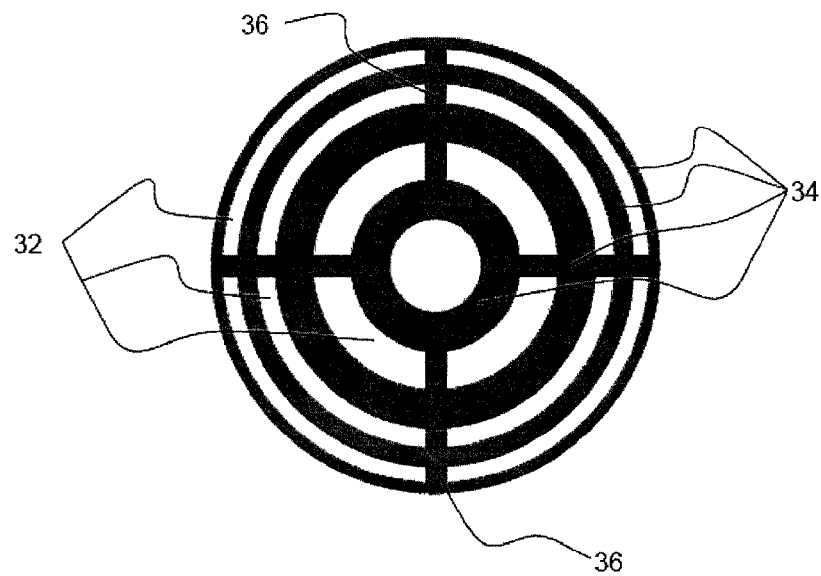
FIG. 3 schematically depicts a zone plate in accordance with an embodiment of the present invention.

FIG. 3 schematically depicts a zone plate ZP according to an embodiment of the present invention. The zone plate ZP is designed to be substantially transparent to EUV radiation, while at the same time suppressing infrared radiation. In order to achieve this, the zone plate ZP comprises a plurality of concentric rings 32 which are substantially transparent to infrared radiation. For example, these rings 32 may be a space provided in the structure of the zone plate ZP. Located inbetween these rings 32 which are transparent to infrared radiation are rings 34 which are substantially opaque to the infrared radiation. These rings 34 may be joined together by support or spokes 36 which are also opaque to infrared radiation. The rings 32, 34 are together designed (as known in the art and as indicated by the above mentioned equations) to diffract a certain wavelength of radiation, for example, infrared radiation having a wavelength of 10.6 μm or DUV radiation having a wavelength of 200 nm.

A difference between the zone plate ZP illustrated in FIG. 3 and known zone plates is that the rings 34 which are opaque to infrared radiation are also substantially transparent to another wavelength of radiation which it is desirable for the zone plate to transmit. For example, this other wavelength may be a wavelength in the EUV radiation range. The rings 32 which are formed from gaps in the zone plate ZP are already transmissive to the EUV radiation. Thus, it will be appreciated that the zone plate ZP serves as a spectral purity filter, since it allows EUV radiation to pass through it but blocks or suppresses by diffraction infrared radiation.

When compared with a continuous (e.g. a sheet or membrane) foil spectral filter, the zone plate ZP of FIG. 3 may be advantageous. EUV radiation incident upon rings 34 which are substantially transparent to EUV radiation will allow a high percentage of EUV radiation to pass through, as is the case with a known metal or foil special purity filter. However, EUV radiation incident on the rings 32 formed from gaps in the zone plate ZP will not have their intensity reduced. This means that a zone plate ZP as shown in and described with reference to FIG. 3 will transmit more EUV radiation than a continuous foil of the same area. At the same time, zone plate ZP will block and suppress by diffraction infrared radiation which has been designed to diffract.

The zone plate according to an embodiment of the present invention comprises alternating first and second regions. The first regions are substantively transparent to a first and second wavelength of radiation, for example the infrared radiation and EUV radiation. For example, these regions may be spaces or gaps in the zone plate ZP, or may be for example, a thin membrane of Si or $Si_3N_4$. The second regions are substantially opaque, reflective or diffractive to the first wavelength of radiation, while at the same time are substantially transparent to the second wavelength of radiation. For instance, the second regions could be formed from a thin foil comprising a thin metal layer, for example a Zr/Si multilayer foil which is substantially transmissive to EUV radiation but substantially opaque to infrared radiation. Alternatively, the second region can be formed from a body (e.g. of the zone plate) comprising a plurality of apertures which forms an aperture spectral purity filter. As known in the art, the aperture spectral purity filter will suppress the second wavelength of radiation either by multiple diffractions in the apertures, absorption in the walls of the apertures, or by reflection. At the same time, the first wavelength of radiation may pass through the apertures unsuppressed if the wavelength is less than the diameter of the apertures. Even if the aperture spectral purity filter allows the second wavelength of radiation to be transmitted through the zone plate, as a consequence of the diffraction it will be sufficiently diffuse so as to have a low intensity along the optical axis. The second regions may comprise any structure or material that acts as a transmissive spectral purity filter which transmits more radiation having the second wavelength of radiation than it does radiation having the first wavelength of radiation.

The first and second regions may comprise a plurality of apertures (e.g. slits or holes). The aperture size in the first region is arranged to be large enough to transmit the first wavelength without substantial diffraction (i.e. the region remains substantially transparent to the first wavelength of radiation). The aperture size in the second region is arranged such that the first wavelength is substantially diffracted or reflected. This design of the zone plate may have considerable advantages in manufacturability and robustness. Substantial diffraction may mean, for example, that most (for example more than 50%) of the radiation is directed out of the primary optical path as measured at a reference point further downstream in the lithography tool, for example at intermediate focus, at reticle level or at wafer level.

In an embodiment, the radius of the zone plates ZP may be approximately 2 cm and the desired focal length may be about 0.1 meters. For the suppression of 10.6 μm radiation, 186 opaque rings may be used, and the width of the narrowest (i.e. outermost) ring may be 27 nm.

In an embodiment, for depression of DUV radiation having a wavelength of 200 nm, 9853 opaque rings are desired, and the width of the outermost ring may be 0.51 nm.

In embodiments described above, the opaque regions may be formed from a material which is substantially transparent to EUV radiation, and which is substantially opaque to infrared and/or DUV radiation. The transparent regions may be formed from gaps in the zone plate.

In principle, the described zone plate ZP can be placed at one of a number of locations in the lithographic apparatus, and anywhere in the path of a radiation beam between its generation point and before it is incident upon the substrate. However, it may be difficult to make a large zone plate (for example, greater than 10 cm in diameter) which is still substantially transparent to EUV radiation. Due to this potential size restriction, it may be desirable to place the zone plates ZP near a focus point of a radiation beam, for example near an intermediate focus of the radiation beam. This allows the zone plate ZP to be relatively small in diameter, and therefore substantially transparent to EUV radiation.

Figure 4:
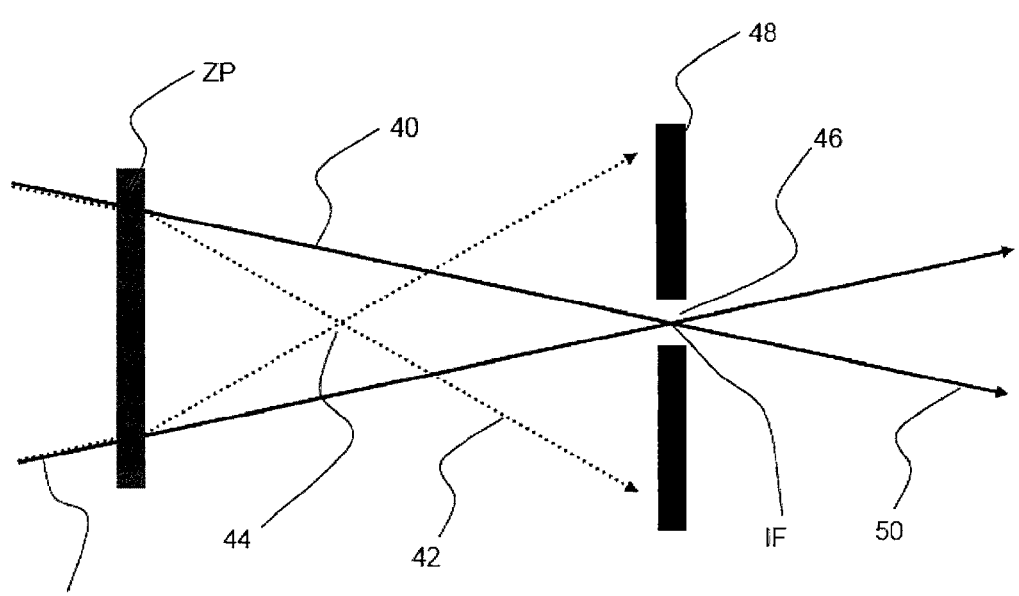
FIG. 4 schematically depicts use of the zone plate shown in FIG. 3, in accordance with an embodiment of the invention.

FIG. 4 illustrates an embodiment where the zone plate ZP is located near an intermediate focus IF of a radiation beam 38. The zone plate ZP is located in the path of the radiation beam 38, and approximately 10 cm upstream from the intermediate focus IF. The radiation beam 38 comprises at least two wavelength components: an EUV component 40, and an infrared component 42. It can be seen that the zone plate ZP substantially transmits the EUV component 40. At the same time, the zone plate ZP diffracts and effectively suppresses the infrared component 42. It can be seen from the Figure that the focal point 44 of the infrared component 42 does not coincide with the intermediate focus IF. This means at the location of the intermediate focus IF the infrared components 44 will be more diffuse and therefore less intense, the majority of the infrared component 42 therefore being prevented from passing further through the lithographic apparatus. It can be seen that the intermediate focus IF is located within an aperture 46 provided in a plate 48. The plate 48 is formed from material which substantially absorbs or reflects the infrared radiation 42, thus preventing it from passing further through the lithographic apparatus. The aperture 46 and plate 48 may be the aperture 20 and a part of the collector chamber 10 shown in and described with reference to FIG. 2. It can be seen that due to the zone plate ZP and the aperture 46 provided in the plate 48, a radiation beam 50 emerging from the aperture 46 comprises mainly EUV radiation.

It will be appreciated that in accordance with this embodiment, all wavelengths of radiation larger than the wavelength for which the zone plate ZP was designed to suppress are also suppressed by at least the same factor. This is because under typical conditions, the focal length of the zone plate ZP is inversely proportional to the radiation wavelength. Therefore, for longer wavelengths, the focal point 44 will be closer to the zone plate ZP, and the radiation will be less intense at the location of the intermediate focus IF.

Figure 5:
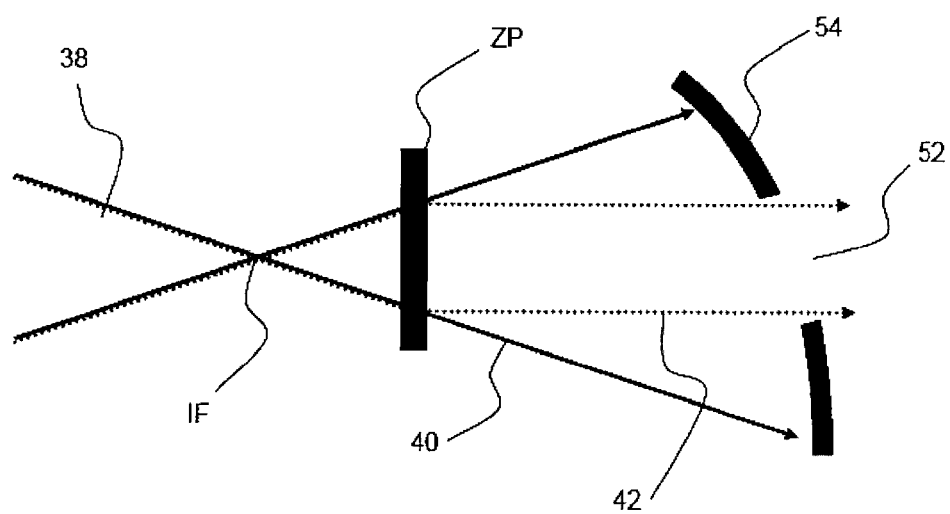
FIG. 5 schematically depicts use of the zone plate shown in FIG. 3, in accordance with an embodiment of the invention.

FIG. 5 depicts an embodiment in which the zone plate ZP is located downstream of the intermediate focus IF of the radiation beam 38, for example, by a distance of approximately 10 cm which in this case equates to the focal length of the zone plate ZP. It can be seen that the zone plate ZP diffracts the infrared radiation component 42 into a substantially parallel beam which passes through an aperture in a field facet mirror 54. The EUV component 40 of the radiation beam 38 passes through the zone plate ZP undiffracted and is then incident upon the field facet mirror 54. The field facet mirror 54 can then redirect the EUV component 40 (which no longer comprises the infrared component 42) to any appropriate location.

In the above embodiments, the zone plate ZP has been shown as comprising rings or circles, or ring segments or circle segments. However, in another embodiment, the zone plate is substantially one-dimensional in that it may comprise a plurality of parallel lines or regions that are designed to be transparent and opaque as described above in relation to the concentric ring zone plate according to the present invention. The width and spacing of the parallel lines or regions are calculated analogously to the two-dimensional circular zone plate described above. Of course, it will be appreciated that the radiation passing through such a zone plate ZP will only be diffracted in one dimension (i.e. perpendicularly to the direction in which the parallel lines or regions extend), but this may give sufficient suppression of an undesired wavelength or wavelengths of radiation. Furthermore, a one-dimensional zone plate may be easier to manufacture than a two-dimensional zone plate.

In the above embodiments, the first and second regions formed within or by the zone plate have been described as being, for example, selectively opaque and transparent to infrared and/or EUV radiation. Although the width of each region may vary, the material comprising each of the first and second regions may be consistent throughout the zone plate. In another embodiment, however, the transmittance or transparency to unwanted or undesired wavelengths need not alternate between two discrete levels, but may vary as a continuous function of distance from the center of the zone plate. Such a principle is known in the art, and will therefore not be described in detail here. For the purposes of describing this invention, it is sufficient to say that if the transparency T has a function of radius r from the center of the zone plate which is described by $$T(r) = \frac{1 + \cos kr^2}{2} \qquad (4)$$

then the diffraction pattern generated by the zone plate will not exhibit any subsidiary maxima outside the main focal point, which are present in the case of a zone plate comprising regions having two alternating discrete levels of transparency. Such an arrangement improves the suppression of unwanted radiation. A continuous transparency profile of the regions may be manufactured, for example, by continuously changing the thickness of the materials forming the rings or the regions of the zone plate, for example the thickness of the metal layer or layers in a thin foil.

In further embodiments, the transparency profile may be such that the areas of the first and second regions are not equal, as would be the case for a conventional zone plate. For example, the areas of the first regions may be made larger than the areas of the second regions, while keeping their positions the same, in order to increase the transmittance of the zone plate for a desired radiation wavelength of radiation. Such a transparency profile will generally decrease the focusing quality of the zone plate, but may still produce sufficient diffraction to achieve the desired suppression of the unwanted wavelength radiation of radiation.

It has already been described how the present invention is advantageous in that, when compared with a continuous metal foil of the same area, the zone plate ZP transmits a higher percentage of EUV radiation. However, in some embodiments an increase in EUV (or any other wavelength) transmittance may not be desired. In this case, embodiments of the invention may still be advantageous in that it may provide a more robust solution than a metal foil. For example, a thin metal foil becomes more robust as it becomes thicker, but this would normally lead to a decrease in EUV transmittance. However, by using such a thicker foil to form rings of the zone plate described above, the transmittance of the EUV radiation can still be at an acceptable level since the EUV radiation can still pass through gaps in the zone plate. For example, instead of using a continuous metal foil with 75% EUV transmittance as a spectral purity filter, one can instead use a thicker metal foil having 50% EUV transmittance. In combination with the formation of this foil into a zone plate as described above, this leads again to an EUV transmittance of 75%, because the EUV radiation can pass through gaps in the zone plate with no loss in intensity. An additional potential advantage of this embodiment is that the zone plate (serving as a spectral purity filter) has an open structure and can therefore better accommodate pressure differences on opposite sides of the zone plate.

Although the above description of embodiments of the invention relates to a radiation source which generates EUV radiation (e.g. 5-20 nm), the invention may also be embodied in a radiation source which generates 'beyond EUV' radiation, that is radiation with a wavelength of less than 10 nm. Beyond EUV radiation may for example have a wavelength of 6.7 nm or 6.8 nm. A radiation source which generates beyond EUV radiation may operate in the same manner as the radiation sources described above. The invention is also applicable to lithographic apparatus that uses any wavelength of radiation where it is desired to separate, extract, filter, etc. one or more wavelengths of radiation from another one or more wavelengths of radiation. The described zone plate may be used, for example, in a lithographic apparatus or a radiation source (which may be for a lithographic apparatus). The invention may also be applied to fields and apparatus used in fields other than lithography.

The description above is intended to be illustrative, not limiting. Thus, it will be apparent to one skilled in the art that modifications may be made to the invention as described without departing from the scope of the claims set out below.

What is claimed is:

1. A zone plate comprising:
   a plurality of consecutively arranged, adjacent, and alternating first and second regions, the first regions being arranged to be substantially transparent to a first predetermined wavelength of radiation and a second predetermined wavelength of radiation that is different from the first predetermined wavelength of radiation, and
   the second regions being arranged to be substantially opaque, diffractive, or reflective to the first predetermined wavelength of radiation and substantially transparent to the second predetermined wavelength of radiation,
   wherein the first wavelength is a wavelength in the infrared part or the deep ultraviolet part of the electromagnetic spectrum, and wherein the second wavelength is a wavelength in the extreme ultraviolet part of the electromagnetic spectrum.

2. The zone plate of claim 1, wherein the first regions are formed by gaps or spaces in the zone plate.

3. The zone plate of claim 1, wherein the first regions comprise Si or $Si_3N_4$.

4. The zone plate of claim 1, wherein the second regions comprise a metal layer, a metal multilayer structure, a foil, or a multilayer foil.

5. The zone plate of claim 1, wherein the second regions comprise a structure or material that acts as a transmissive spectral purity filter, and is configured to transmit more radiation having the second wavelength of radiation than radiation having the first wavelength of radiation.

6. The zone plate of claim 1, wherein the first regions are provided with a plurality of apertures, and wherein the apertures of the first regions are dimensioned to not provide substantial diffraction of the first wavelength of radiation.

7. The zone plate of claim 1, wherein the second regions are provided with a plurality of apertures, and wherein the apertures of the second regions are dimensioned to provide diffraction or reflection of the first wavelength of radiation.

8. An arrangement comprising:
   a zone plate comprising a plurality of consecutively arranged, adjacent, and alternating first and second regions,
   the first regions being arranged to be substantially transparent to a first predetermined wavelength of radiation and a second predetermined wavelength of radiation that is different from the first predetermined wavelength of radiation, and
   the second regions being arranged to be substantially opaque, diffractive, or reflective to the first predetermined wavelength of radiation and substantially transparent to the second predetermined wavelength of radiation,
   wherein the first wavelength is a wavelength in the infrared part or the deep ultraviolet part of the electromagnetic spectrum, and wherein the second wavelength is a wavelength in the extreme ultraviolet part of the electromagnetic spectrum; and
   a structure provided with an aperture.

9. The arrangement of claim 8, wherein the zone plate and aperture are located relative to one another such that a focal point of the zone plate for the first wavelength of radiation is located away from the aperture.

10. The arrangement of claim 8, wherein the zone plate is located downstream of a focus point of a radiation beam comprising the first wavelength of radiation and the second wavelength of radiation, the zone plate being located downstream of the focus point by a distance equal to the focal length of the zone plate for the first wavelength of radiation, such that a parallel beam of radiation comprising the first wavelength of radiation emerges from the zone plate and is arranged to pass through the aperture.

* * * * *